United States Patent [19]
Yamaguchi et al.

[11] Patent Number: 5,445,521
[45] Date of Patent: Aug. 29, 1995

[54] HEAT TREATING METHOD AND DEVICE

[75] Inventors: Eiji Yamaguchi; Kaoru Fujihara, both of Yamanashi; Takenobu Matsuo, Kofu; Hirofumi Kitayama, Kanagawa, all of Japan

[73] Assignees: Tokyo Electron Kabushiki Kaisha; Tokyo Electron Tohoku Kabushiki Kaisha, both of Japan

[21] Appl. No.: 250,379

[22] Filed: May 27, 1994

[30] Foreign Application Priority Data

May 31, 1993 [JP] Japan .................................. 5-152995
Jun. 11, 1993 [JP] Japan .................................. 5-166471

[51] Int. Cl.⁶ .............................................. F27D 5/00
[52] U.S. Cl. ........................................ 432/5; 432/152; 432/241; 432/206
[58] Field of Search ................. 432/241, 5, 6, 24, 47, 432/206, 152

[56] References Cited

U.S. PATENT DOCUMENTS

| | | | |
|---|---|---|---|
| 5,207,573 | 5/1993 | Miyagi et al. | 432/206 |
| 5,271,732 | 12/1993 | Yokokawa | 432/241 |
| 5,273,424 | 12/1993 | Kobayashi | 432/241 |
| 5,277,579 | 1/1994 | Takanabe | 432/5 |
| 5,328,360 | 7/1994 | Yokokawa | 432/5 |
| 5,330,352 | 7/1994 | Watanabe et al. | 432/152 |

FOREIGN PATENT DOCUMENTS 56-158430 12/1981 Japan .
64-33566 3/1989 Japan .
3-219200 9/1991 Japan .
3-229414 10/1991 Japan .

Primary Examiner—Andrew M. Dolinar
Attorney, Agent, or Firm—Beveridge, DeGrandi, Weilacher & Young

[57] ABSTRACT

A heat treating device including a pressure detecting unit for outputting an output signal when a pressure in a heat processing furnace becomes a set value, an air release pipe having a first valve and a check valve, a differential pressure gauge shut off by a second valve in terms of pressure from the interior of the heat processing furnace, and an air feed pipe having a third valve. One ends of each of the air release pipe and the air feed pipe is connected respectively to the heat processing furnace and the other ends opened in air. In such arrangement, after processing gases are evacuated from the heat processing furnace, an inert gas is fed. Then when an internal pressure of the furnace becomes near an air pressure, the first valve is opened in response to the output signal of the pressure detecting unit to make the internal pressure of the heat processing furnace a little higher than the air pressure. When a differential pressure value of the differential pressure gauge is below a set value, the third value is opened to communicate the interior of the heat processing furnace with air through the air feed pipe. Then the cap closing the opening of the heat processing furnace is opened.

4 Claims, 7 Drawing Sheets

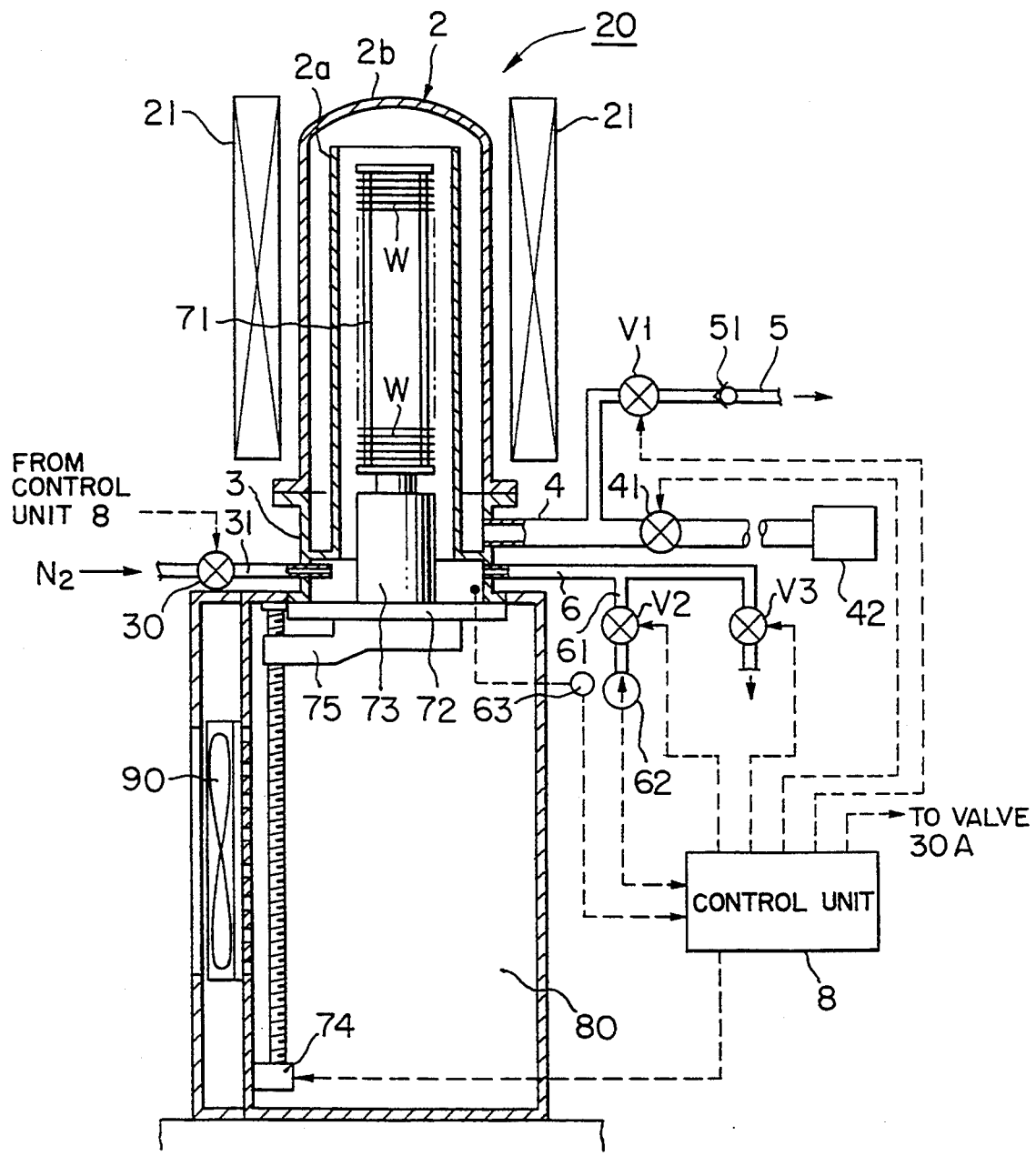
F I G. 1

HEAT TREATING METHOD AND DEVICE

BACKGROUND OF THE INVENTION

The present invention relates to a heat treating method and device.

The fabrication process for fabricating a semiconductor wafer (hereinafter called "wafer") includes processing of heat treatments for film deposition, impurities diffusion, etc. As devices for conducting such heat treatments, recently vertical heat treating devices are more used in place of horizontal heat treating devices because the former takes the outside air into the processing chambers.

FIG. 6 shows a conventional vertical heat treating device. This vertical heat treating device includes a heat processing furnace having a reaction tube 1 of a double structure of a vertical inner tube 1a and a vertical outer tube 1b, and a heater 11 provided around the reaction tube 1. A wafer boat 12 with a number of sheets of wafers W supported in a shelves-like manner is loaded by means of a boat elevator into the heat processing furnace from below for a heat treatment. For suppressing intrusion of air, nitrogen gas ($N_2$) is introduced into the heat processing furnace before a cap 14 on the lower end of the heat processing furnace is lowered when the heat treatment is over, i.e., before the wafer boat 12 is lowered. A pressure switch 16 for detecting an internal pressure of the heat processing furnace is set so as to be turned on when an internal pressure of the heat processing furnace becomes a little higher than the air pressure. When the pressure switch 16 is turned on, a control unit 17 supplies a drive instruction to a motor 18 of the boat elevator 13 to lower the wafer boat 12.

Here, the air pressure largely varies depending on pressure distributions, and an internal pressure of the heat processing furnace at the time when the set pressure switch is turned on is always constant. Accordingly a large pressure difference often takes place between the inside of the heat processing furnace and the outside thereof when the cap 14 is opened. In such cases, large turbulent air flows take place near the opening of the heat processing furnace when the cap 14 is opened and causes particles to float. These particles stay on the surfaces of the wafers W.

Recent devices are so integrated that their pattern widths are very micronized. Allowances for the deprint of the particles are more restricted. Deposit of the particles on the wafers when the wafers are unloaded out of the heat processing furnace is one factor of low yields of the devices. This is one problem.

When an outside air pressure is higher than an internal pressure of the heat processing furnace when the cap 14 is opened, the air intrudes into the heat processing furnace, and the surfaces of the wafers W contact with oxygen in a high-temperature ambient air. Accordingly there is a risk that natural oxide films will be formed on the surfaces of of the wafers W, especially those located below the wafer boat 12. Here, in a case where a next step is vulnerable to natural oxide films, the surfaces of the wafers W are rinsed. But the thus-formed oxide films have disuniform film thicknesses, and inhomogeneous, so it is difficult to evenly remove them by the rinse. For example, residual poor-quality oxide films in silicon nitride films of multi-layer insulating films which are increasingly used in accordance with higher integration of DRAMs degrades characteristics of the devices. This is also a factor of lower yields of the devices. This is also a problem.

In heat treatments using harmful substances, such as phosphorus diffusion or others, residual phosphorus-content gases after the treatments often cause environmental problems. Also particles often stay on the wafer boat for mounting the wafers, etc. As treatments are repeated with particles residing in the space of the opening of the reaction tube, a number of the particles increases, and the particles intrude into the reaction vessel whenever the wafer boat is loaded into and unloaded out of the reaction vessel. As heat treatments are repeated, the particles stay on the wafers. Accordingly treatment precision is lowered, and accordingly yields of the devices are lowered.

In a case that, as shown in FIG. 7, maintenance is conducted when a 10th, for example, treatment is over, preferably a particle number does not exceed a reference value as in A, but as in B sometimes the reference value is exceeded when a ninth treatment is over. A maintenance timing has been conventionally set based on treatment times. Accordingly even in a case that although a treatment time is few, a particle number have increased, treatments are still repeated. Even in the presence of a number of particles above a reference value in the reaction tube, treatments are conducted on the wafers with particles staying on. Accordingly the treatment precision is lowered, and yields of the devices are lowered.

SUMMARY OF THE INVENTION

The present invention was made in view of these problems, an object of the present invention is to provide a heat treating method and a heat treating device which preclude turbulent air flows when a cap is opened so as to suppress generation of particles, and prevent the posture of the wafers on the wafer boat from being disturbed.

With the heat treating device according to the present invention, a number of objects to be treated are loaded into a heat processing furnace, mounted on holding means and are heat treated therein. An inert gas is introduced into the heat processing furnace after the heat treatment, and a cap closing an opening of the furnace is opened when a pressure in the furnace becomes near to air pressure, to unload the objects on the holding means out of the furnace. The device comprises a pressure detecting unit for outputting an output signal when a pressure in the heat processing furnace exceeds a set pressure value near an air pressure, an air release pipe having one end connected to the heat processing furnace and the other end opened in air, and including a first valve which is to be opened in response to the output signal of the differential pressure detecting unit, and a check valve for prohibiting reverse gas flows from air into the heat processing furnace. The device also has a differential pressure detecting unit provided in a region shut off by a second valve in terms of pressure with respect to the heat processing furnace, for detecting a differential pressure between a pressure in the heat processing furnace and the air pressure, and a control unit for opening the first and the second valves in response to the output signal of the pressure detecting unit. The control unit also opens and the cap when a value of the differential pressure detected by the differential pressure detecting unit becomes below a set value.

In this device, an inert gas is fed after the objects have been heat treated, and when an internal pressure of the heat processing furnace becomes near to an air pressure, the valve of the air release pipe is opened. At this time, when the internal pressure is above an operational pressure of the check valve, the check valve is opened, and the interior of the heat processing furnace is communicated with air while reverse flow of air are prohibited. The cap is opened when it is judged, based on a detected differential pressure value of the differential pressure detecting unit, that substantially no differential pressure is present between the internal pressure of the heat processing furnace and air. Accordingly turbulent flow of air caused by the opening of the cap can be suppressed, and generation of particles can be precluded.

The heat treating device according to another embodiment of the present invention comprises a reaction vessel, mounting means for mounting a number of objects to be treated, loading/unloading means for loading and unloading the objects to be treated into and out of the reaction vessel for a heat treatment, particle collecting means disposed in a loading chamber below an opening of the reaction vessel, means for measuring a number of the collected particles, and means for judging whether the measured particle number is below a set value.

In this arrangement, every time a treatment is conducted, a particle number at the time of loading/unloading the mounting means into the reaction vessel can be measured to judge whether the measured particle number is below a set particle number.

BRIEF DESCRIPTION OF THE DRAWINGS

FIG. 1 is a vertical sectional view of a heat treating device according to a first embodiment of the present invention.

DETAILED DESCRIPTION OF PREFERRED EMBODIMENTS

First Embodiment

Figure 2:
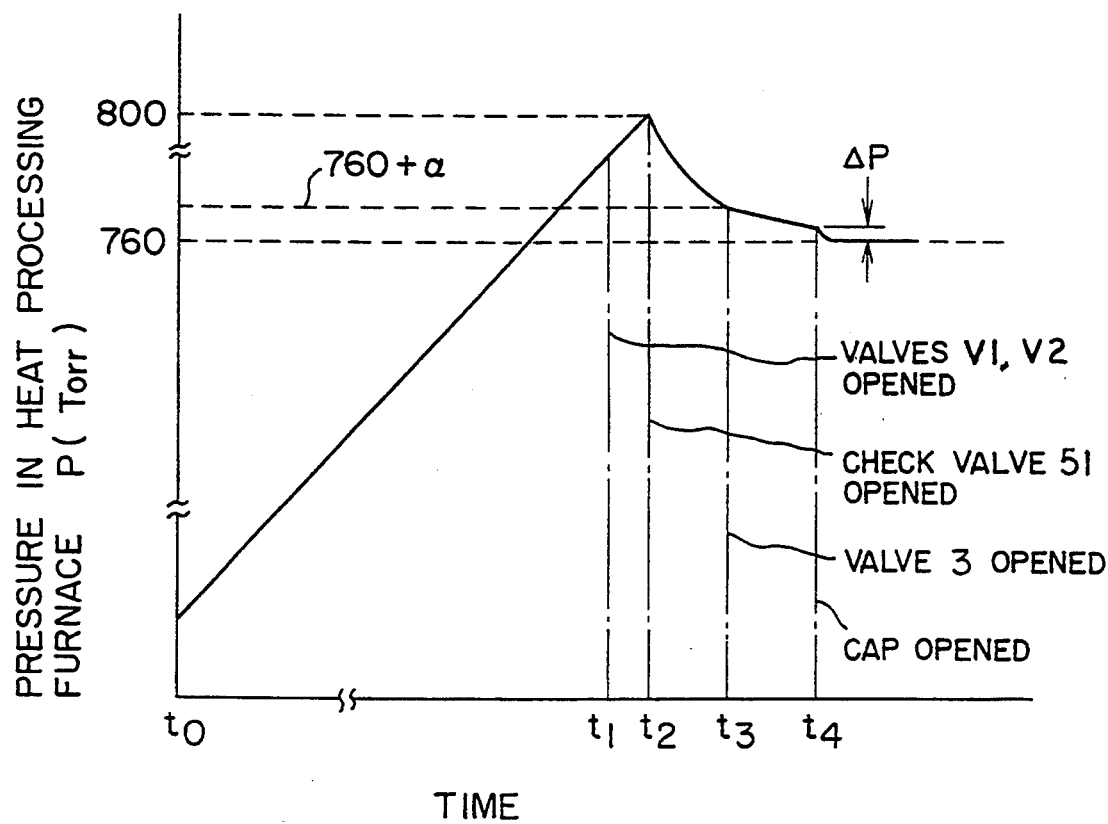
FIG. 2 is a characteristic curve of transient changes of a pressure in the heat processing furnace of the heat treating device of FIG. 1.

FIG. 1 is a vertical sectional view of the vertical heat treating device according to a first embodiment of the present invention. In FIG. 1, reference numeral 2 indicates a reaction tube of a double-structure including an inner tube 2a and an outer tube 2b both of, e.g., quartz. A heater 2 surrounds the reaction tube 21. A manifold of a metal (e.g., SUS) is provided on the lower end of the reaction tube 2. Thus a heat treating furnace 20 comprises these members.

In the circumferential surface of the manifold 3 there are circumferentially arranged a processing gases feed pipe (not shown) for introducing processing gases, a gas feed pipe 31 for introducing an inert gas, e.g., nitrogen gas, into the reaction tube 2 after a heat treatment, and an exhaust pipe 4 for discharging outside the processing gases and the inert gas.

The exhaust pipe 4 is connected to a vacuum pump 42 through a valve 41, and one end of an air release pipe 5 is branched to be connected to the exhaust pipe 4 upstream of the valve 41. The other end of the air release pipe 5 is opened in air. In the air release pipe 5 there are inserted a valve V1 (a first valve) and a check valve 51 for prohibiting gas flow (reverse flow) from the side of air into the heat processing furnace 20 in the stated order from upstream of the exhaust. In the first embodiment the air release pipe 5 is connected to the heat processing furnace 20 through the exhaust pipe 4, but may be connected directly to the manifold 3.

Further one end of an air feed pipe 6 is connected to the manifold 3. A differential pressure detecting unit, e.g., a differential pressure gauge 62 for measuring a pressure difference between a pressure in the heat processing furnace 20 and air pressure in loading chamber 80 is provided in a pipe 61 branched from the air feed pipe 6. A valve V2 (a second valve) is provided in the pipe 61 for separating the differential pressure gauge 62 from the interior of the heat processing furnace 20. A valve V3 is provided in the air feed pipe 6, and the distal end of the air feed pipe 6 is opened in air. Clean air feed means 90 is provided on a side of the laoding chamber 80 to side-blow clean air of the air pressure into the loading chamber 80.

In the manifold 3 there is provided a pressure detecting unit 63 in the form of, e.g., a vacuum switch which is turned on when a pressure in the heat processing furnace 20 exceeds a set pressure near the atmospheric pressure, e.g., 770 Torr, and outputs a signal. One hundred (100) sheets, for example, of wafers W are loaded in the reaction tube 2, horizontally mounted on holding means, e.g., a wafer boat 71, vertically spaced from each other. The wafer boat 71 is held on a cap 72 through a heat insulating cylinder 73. The cap 72 is mounted on a boat elevator 75 which is moved up and down by a motor 74 to load/unload the wafer boat 71 into/out of the heat processing furnace 20. The boat elevator 75 closes the lower end opening of the manifold 3, i.e., the lower end opening of the heat processing furnace 20 when located at its uppermost position.

A control unit 8 is built in, e.g., a control unit of the heat treating device for receiving output signals of the pressure detecting unit 63 and detected differential pressure values of the differential pressure gauge 62, conducting sequence control of the valves V1-V3, 30, 41, and controlling drive of the motor 74 for moving up and down the boat elevator 75.

Next the operation of the first embodiment will be explained. First the interior of the reaction tube 2 is set at a required temperature. Then 100 sheets, for example, wafers W, of objects to be treated are mounted on the wafer boat 71, and the boat elevator is lifted to load the wafer boat 71 into the reaction tube 2 through the lower end opening. Then the interior of the reaction tube 2 is evacuated, and processing gases are introduced into the reaction tube 2 through the gas feed pipe (not shown) to conduct a heat treatment, e.g., CVD treatment on the wafers W.

When the heat treatment is over, the introduction of the processing gases is stopped, and the interior of the reaction tube 2 is evacuated by the vacuum pump 42 to a required vacuum degree (e.g., 0.01 Torr). Then, the control, unit 8 closes the valve 41 of the exhaust pipe 4 while it opens the valve 30 of the gas feed pipe 31 to introduce an inert gas, e.g., nitrogen ($N_2$) gas into the heat processing furnace 20.

FIG. 2 is a view of transient changes of a pressure P in the heat processing furnace tube 20 after $N_2$ gas is introduced. Here the valve 30 is opened at a time t.

As shown in FIG. 2, when the pressure P in the heat processing furnace 20 rises to, e.g., 770 Torr at a time $t_1$, the pressure detecting unit 63 is turned on and supplies an output signal to the control unit 8. In response to the output signal the control unit 8 supplies commands to open the valve V1 of the air release pipe 5 and the valve V2 on the input side of the differential pressure gauge 62. In response to these commands, the valves V1, V2 are opened to let in the $N_2$ gas in the heat processing furnace 20 up to the check valve 51, and the differential pressure gauge 62 is actuated. When the pressure P in the heat processing furnace 20 arrives at an operational pressure (cracking pressure), 800 Torr, of the check valve 51 (at a time $t_2$), the check valve 51 is opened.

Consequently the pressure P in the heat processing furnace 20 drops. When the pressure P drops down to a pressure which is higher than an air pressure in the loading chamber 80 by a set differential pressure value of the differential pressure gauge 62, e.g., some ($\alpha$) Torr (a time $t_3$), the valve V3 of the air feed pipe 6 is opened in response to a command of the control unit 8. Thus the interior of the heat processing furnace 20 and the air is communicated with each other through the air feed pipe 6 to make the pressure P in the heat processing furnace substantially equal to the air pressure. When the valve V3 has been opened by the control unit 8, and after a set period of time has passed (at a time $t_4$), the control unit 8 supplies a command to actuate the motor 74, and the motor 74 is actuated to lower the boat elevator 74, and the cap 72 is opened. Here in FIG. 2 a differential pressure at the time $t_4$ is represented by $\Delta P$, and the $\Delta P$ is as small as some Torr (e.g., 5 Torr).

Thus according to the first embodiment, when a pressure P in the heat processing furnace 20 becomes near to an atmospheric pressure, the interior of the heat processing furnace 20 is released to air while reverse flow from the side of air is prohibited by the check valve 51. The air feed pipe 6 is opened when the pressure P becomes a little higher than the air pressure. Accordingly air does not flow reversely into the heat processing furnace 20 through the air feed pipe 6, and the pressure P in the heat processing furnace can be made substantially the same as the air pressure. In this state the cap 72 is opened. Accordingly turbulent air flow near the lower end opening of the heat processing furnace 20 can be precluded, and generation of particles can be suppressed. Since inflow of air into the heat processing furnace 20 can be suppressed, formation of thick inhomogeneous natural oxide films on the surfaces of the wafers W in the heat processing furnace 20 can be prohibited, and disturbance of the correct posture of the wafers on the wafer boat can be prevented.

The valve V2 is opened to actuate the differential pressure gauge 62 when the air release pipe 5 is opened to make a pressure P in the heat processing furnace 20 becomes near to an air pressure. Accordingly a differential pressure gauge for detecting a trace of differential pressure cannot be damaged by differential pressures higher than an allowable limit applied thereto.

In the first embodiment of the present invention, the same effect can be produced by the valve V2 on the input side of the differential pressure gauge 62, and the valve V3 of the air feed pipe 6 are opened, e.g., simultaneously or at different timings from each other, and the cap 72 is opened (at this time the boat elevator 75 is lowered) when a differential pressure value of the differential pressure gauge 62 is below a set value. It is also possible that the air feed pipe 6 is not used, and the cap 72 is opened when a detected differential pressure value is below a set value after the valves V1, V2 are opened. The valve V2 may be opened before the valve V1 is opened after an output signal of the pressure detecting unit is supplied.

The pressure detecting unit 63 is not essentially a vacuum switch. It is possible that an absolute pressure gauge is used, and when a detected value exceeds a set value, an output signal is supplied. The present invention is not limited to the vertical CVD device according to the above-described first embodiment, and may be applied to vertical oxidation and diffusion furnaces, or may be applied to horizontal heat processing furnace.

Second Embodiment

Figure 3:
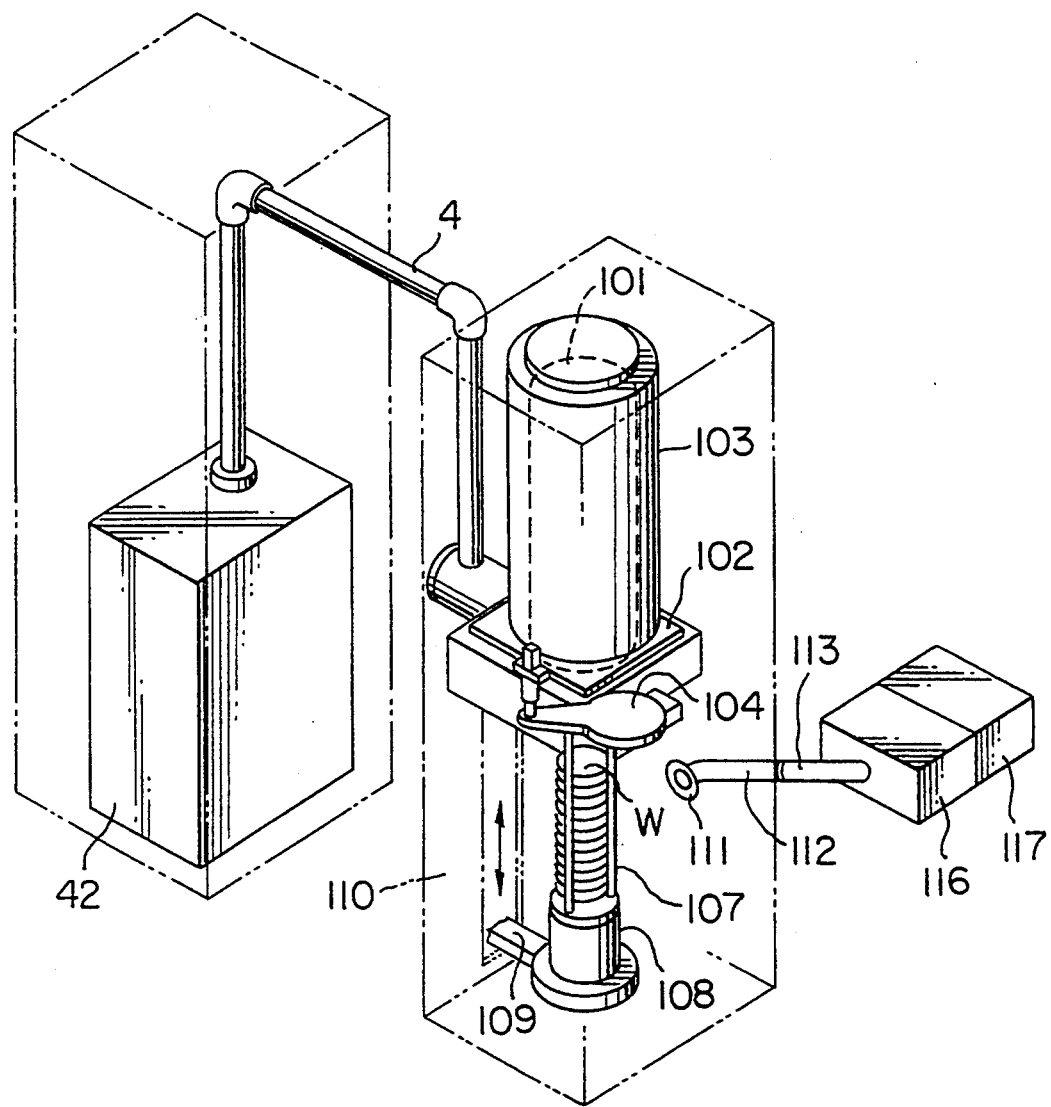
FIG. 3 is a perspective view of a heat treating device according to a second embodiment of the present invention.

A second embodiment of the present invention will be explained with reference to FIGS. 3 to 5.

First, a vertical heat treating device for practicing the second embodiment of the present invention will be explained. As shown in FIG. 3, this vertical heat treating device includes a cylindrical reaction vessel 101 having its length vertically arranged.

The reaction vessel 101 has the lower end supported by a manifold (not shown) of SUS or others. The manifold is secured to a base plate 102. A cylindrical heater (not shown) in the form of, e.g., a resistance heater surrounds the reaction vessel 101. A heat processing unit comprises these members. A heat insulating layer of, e.g., silica block is formed on the outside of the heater for heating the heat processing unit. A cylindrical outer casing 103 of, e.g., SUS surrounds the heat treating device on the outside of the heat insulating layer.

A cylindrical cap 104 of, e.g., SUS is provided in the lower end opening of the base plate 102. The cap 104 is capable of swivelling.

In a loading chamber 110 in an opening of the reaction vessel 101 a wafer boat 107 is mounted on a boat mount 108. The wafer boat 107 accommodates a number (100 sheets) of objects to be treated, e.g., semiconductor wafers W vertically spaced by, e.g., a 4.76 mm interval. The boat mount 108 is loaded into and unloaded out of the reaction vessel 101 through the opening thereof by, e.g., a boat elevator 109. FIG. 3 shows the wafer boat 107 unloaded out of the reaction vessel 101, i.e., the wafer boat 107 outside the reaction vessel 101.

A suction port 111 for collecting residual particles in a loading chamber 110 which spaced below the opening of the opening of the reaction vessel 101 is provided in the loading chamber. The suction port 111 is connected to a pipe 112 of SUS and is connected to a pipe 113 of SUS through a joint not shown. The pipe 113 has a measuring unit 116 for measuring a number of particles sucked and collected through the suction port 111. The measuring unit 116 has a judging unit 117 for judging whether a measured particle number is in a set value.

The heat treating device according to the second embodiment of the present invention having the above-described structure will be explained.

First, 100 sheets, for example, of semiconductor wafers are mounted on the wafer boat 107, and then the cap 104 is turned and opened to load the boat elevator 109 up into the reaction vessel 101.

In the reaction vessel 101 oxidation, diffusion or CVD is conducted on the semiconductor wafers W. When the treatment is over, the boat elevator 109 is lowered to unload the water boat 107 into the loading chamber 110 outside the reaction vessel 101. Then the cap 104 is closed, and the wafer boat is let to stand for about 10 minutes to let the semiconductor wafers W cool off.

Then, the semiconductor wafers W are taken out of the wafer boat 107, and a set number of sheets of semiconductor wafers W to be next treated are mounted on the wafer boat 107.

The above-described treatment is repeated, and every time one treatment is over, particles are collected through the suction port 111, then a number of the collected particles is measured by the measuring unit 116, and the judging unit 117 judges whether a measured particle number is below a set value.

When the measured particle number is below the set value (e.g., 10 pieces/ft$^3$), a next treatment is conducted in a state as it is. When the measured particle number is above the set value, the next treatment is not started to maintain the heat treating device.

Repetition of this step makes it possible to correctly know changes of numbers of particles generated in respective treatments. Furthermore, treatments can be conducted with particle numbers suppressed below a set value.

Figure 4:
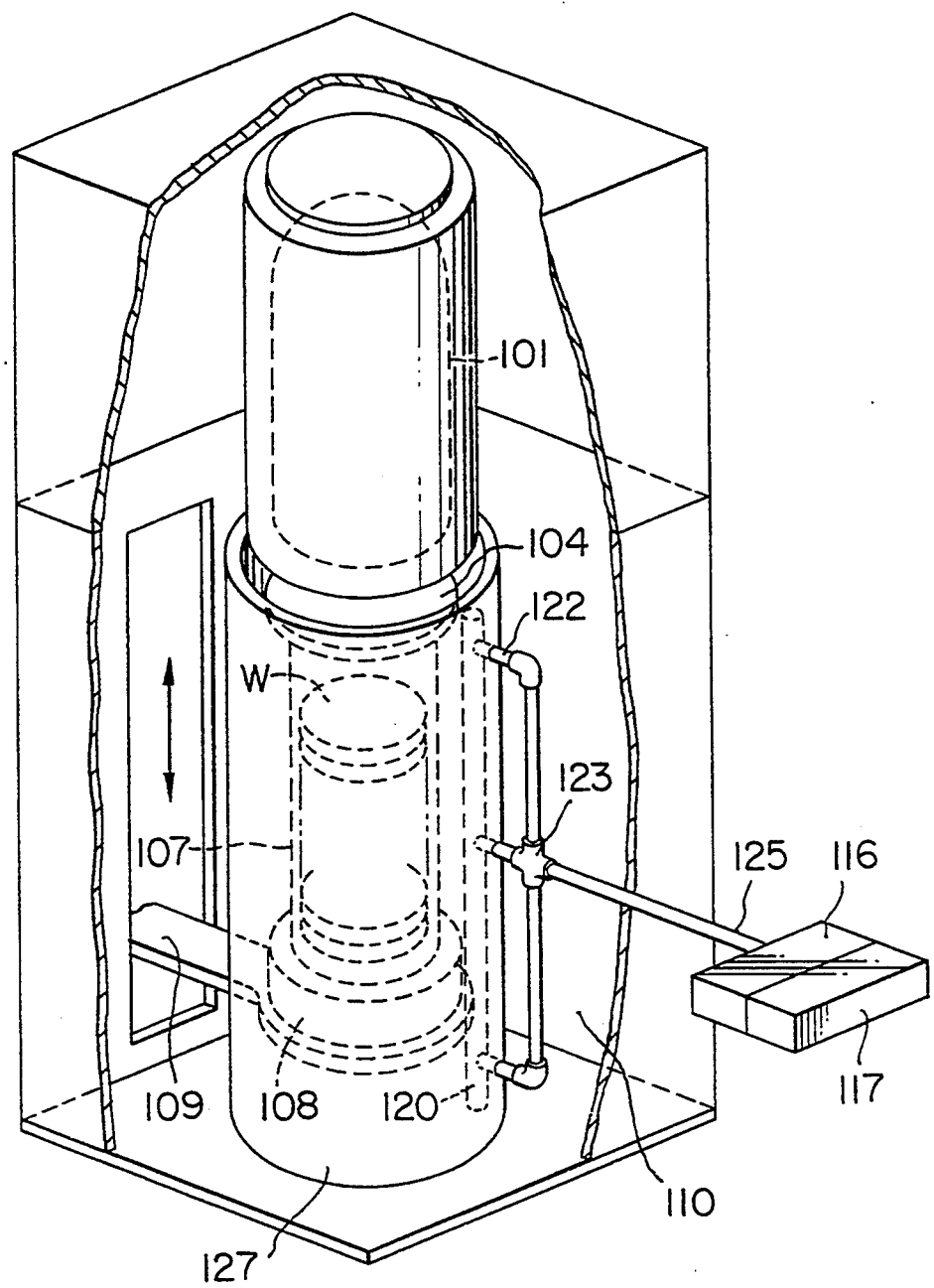
FIG. 4 is a partial broken perspective view of a modification of the heat treating device according to the second embodiment of FIG. 3, especially a particle sucking portion.
Figure 5:
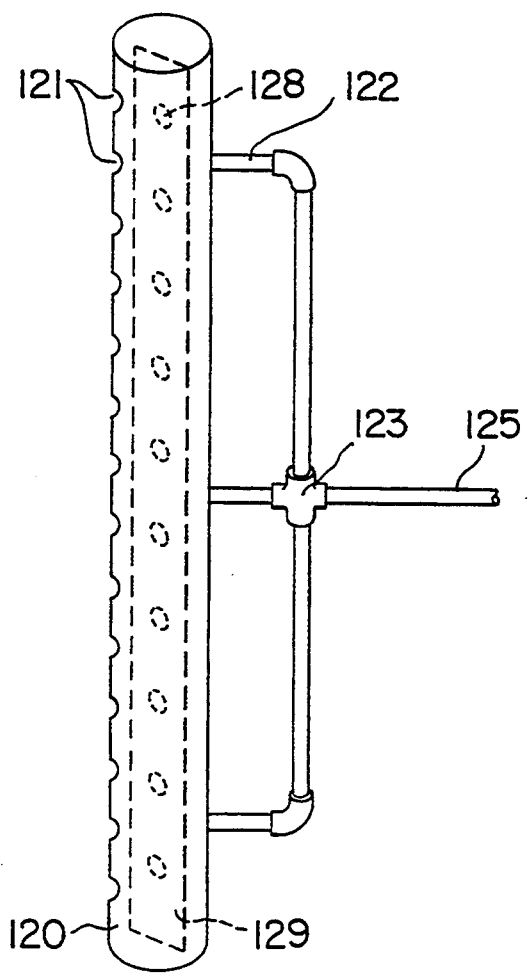
FIG. 5 is a side view of the particle sucking portion of FIG. 4.
Figure 6:
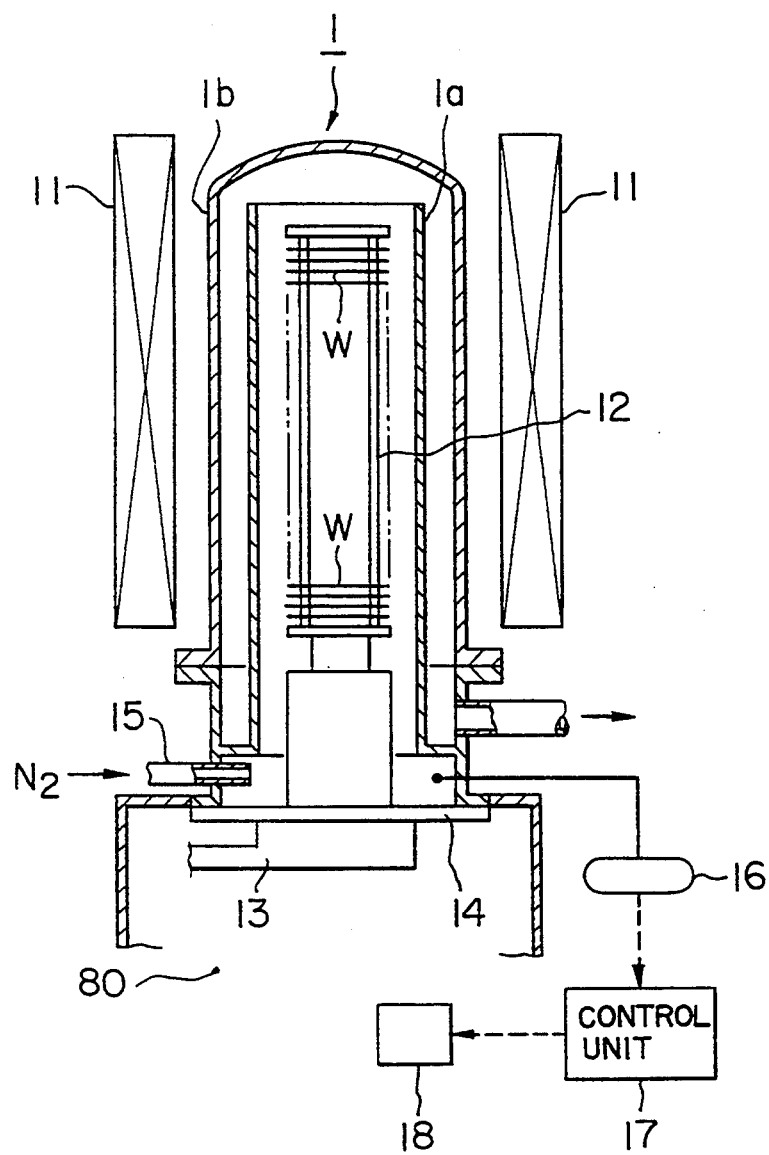
FIG. 6 is a schematic view of one example of the conventional heat treating devices.
Figure 7:
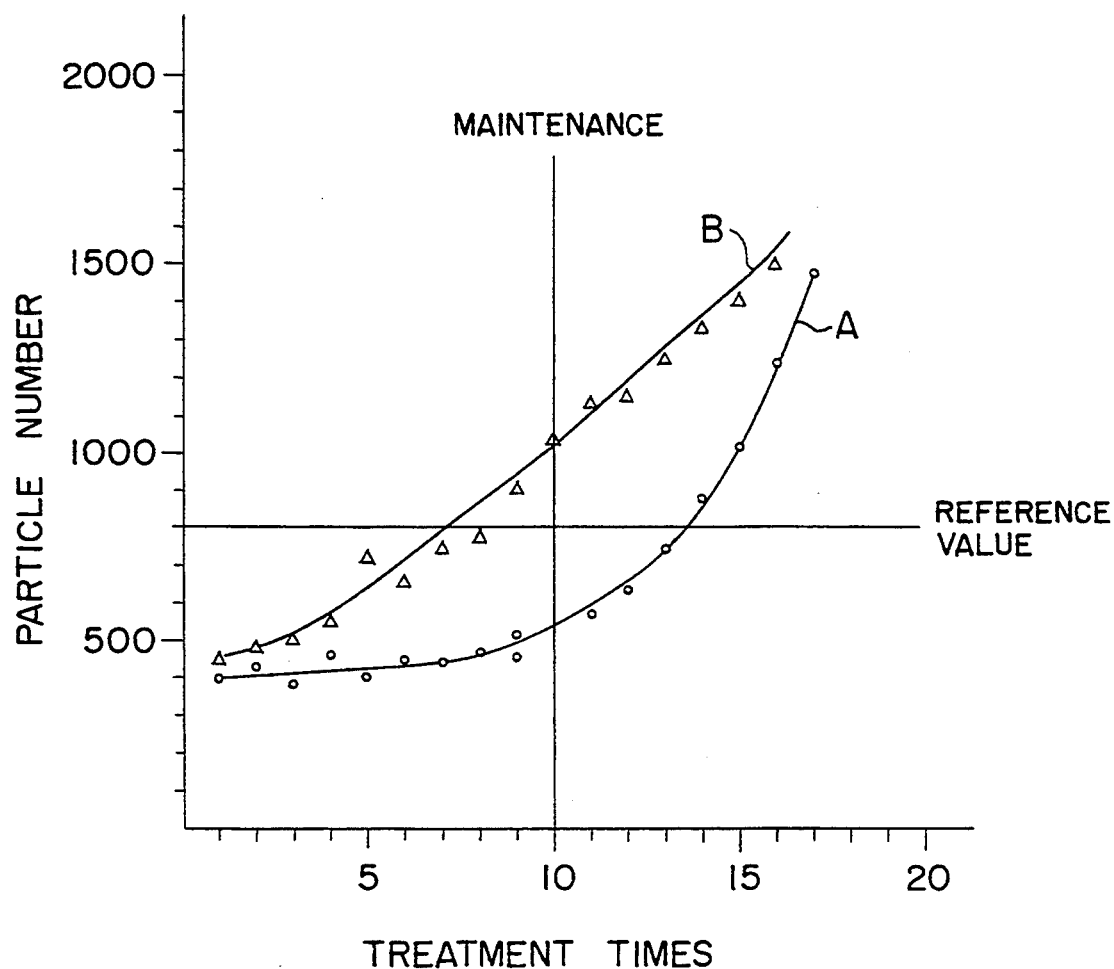
FIG. 7 is a graph of interrelationships between treatment times and particle number of particles and staying on the wafers or floating near the furnace opening of the heat treating device according to the second embodiment of the present invention and the conventional heat treating device.

As shown in FIGS. 4 and 5, a cylindrical body 120 is provided in parallel with a length of the reaction vessel 101 in a space below the opening of the reaction vessel 101. Seventeen (17), for example, suction openings 121 of, e.g., a 1 mm-diameter are provided in the cylindrical body 120 at a set interval of, e.g., 50 mm for sucking particles in the space (see FIG. 5). As shown in FIG. 5, a plurality (e.g., 3) of pipes 122 of SUS are connected to the cylindrical body 120 spaced from each other along the length of the reaction vessel 101 and opposed to the SUD suction openings 121 of the cylindrical body 120. These pipes 122 are connected to a pipe 125 of SUS through a stainless joint 123. A measuring unit 116 for counting a number of particles collected through the suction openings 121 is provided in the pipe 125. A judging unit 117 for judging whether the counted particle number is below a set value is provided in the measuring unit 116.

As shown in FIG. 4, in the space of the opening of the reaction vessel 101 there is provided a cover 127 which covers the cylindrical body 120 and the wafer boat 107, and the boat mount 108 and the boat elevator 109.

This arrangement enables particles to be collected in the small space through the suction openings 121, whereby their collection can be more accurate.

Since the cylindrical body 120 is provided in parallel-with the length of the reaction vessel 101, particles can be uniformly collected in the vertical direction of the space of the opening of the reaction vessel 101.

As shown in FIG. 5, in the cylindrical body 120 there is provided a buffer plate 129 with a plurality (e.g., 10) of rectifying holes 128 of a 20 mm diameter, so that when particles are collected through the suction openings 121, the sucking speed can be set at the same speed, e.g., 0.3 m/min, as flow speeds of clean air flowing in the loading chamber 110 of the reaction vessel 101. Consequently the particle collection can be even without the influence of flows of gases in the space.

Although gases collected through the suction openings 121 have high temperatures, e.g., 100° C., because the pipe 125 is made of SUS, the collected gasses can be sufficiently cooled during their passage through the pipe 125. The measuring unit has heat resistance only up to 40° C. If a gas of 100° C. should be mixed in, the measuring unit 116 will be broken. But the collected gases can be cooled down to substantially 25° C. during their passage through the pipe 125, and the measuring unit 116 can be kept from breakage due to high-temperature gases.

What is claimed is:

1. A heat treating method comprising:
    loading into a heat processing furnace a number of objects to be treated mounted on holding means and heat treating the objects;
    introducing an inert gas into the heat processing furnace after a heat treatment;
    detecting a pressure inside the heat processing furnace by first pressure detecting means, and generating an output signal from the first pressure detecting means when a pressure inside the heat processing furnace exceeds a first set pressure near atmospheric pressure outside of the heat processing furnace;
    opening a first valve and a second valve in response to the output signal of the first pressure detecting means, the first valve being disposed in an air release pipe for releasing gas from inside the heat processing furnace;
        detecting a differential pressure between a pressure inside the heat processing furnace and atmospheric pressure outside the heat processing furnace with a differential second pressure detecting means disposed in a region isolatable from the heat processing furnace by the second valve; and
    opening a cap of the heat processing furnace when the differential pressure detected by the second pressure detecting means falls below a second set pressure.

2. The heat treating method according to claim 1, wherein, when the differential pressure detected by the second pressure detecting means falls below the second set pressure, a third valve is opened, the third valve being provided in an air feed pipe having one end in fluid communication with inside the heat processing furnace and another end in fluid communication with outside of the heat processing furnace.

3. A heat treating device in which a number of objects to be treated are loaded into a heat processing furnace, mounted on holding means and are heat treated therein, an inert gas is introduced into the heat processing furnace after the heat treatment, and a cap closing an opening of the furnace is opened to unload the objects on the holding means out of the furnace, the device comprising:
    a heat processing furnace having an inside and an outside, the heat processing furnace having an openable cap;

first pressure detecting means for outputting an output signal when a pressure inside the heat processing furnace exceeds a first set pressure near atmospheric pressure;

a first air release pipe having one end in fluid communication with inside of the heat processing furnace and another end in fluid communication with outside of the heat processing furnace, the first air release pipe including a first valve which opens in response to the output signal of the first pressure detecting means, and a check valve for prohibiting reverse gas flow from outside of the heat processing furnace into inside of the heat processing furnace;

a differential second pressure detecting means for detecting a differential pressure between a pressure inside of the heat processing furnace and atmospheric pressure outside of the heat processing furnace, the second pressure detecting means being isolatable from gas inside of the heat processing furnace by a second valve; and a control unit for opening the first and the second valves in response to the output signal of the first pressure detecting means, and for opening the cap when the differential pressure detected by the differential second pressure detecting means falls below a second set pressure.

4. The heat processing device according to claim 3, further including a second air release pipe having one end in fluid communication with inside of the heat processing furnace and another end in fluid communication with outside of the heat processing furnace, the second air release pipe having a third valve, wherein, when the differential pressure detected by the differential second pressure detecting means falls below the second set pressure, the control means first opens the third valve of the second air feed pipe, and then subsequently opens the cap.

* * * * *